US009478277B1

(12) United States Patent
Liu

(10) Patent No.: US 9,478,277 B1
(45) Date of Patent: Oct. 25, 2016

(54) TRI-LEVEL-CELL DRAM AND SENSE AMPLIFIER WITH ALTERNATING OFFSET VOLTAGE

(71) Applicant: Bo Liu, Milpitas, CA (US)

(72) Inventor: Bo Liu, Milpitas, CA (US)

(73) Assignee: Bo Liu, Milpitas, CA (US)

( * ) Notice: Subject to any disclaimer, the term of this patent is extended or adjusted under 35 U.S.C. 154(b) by 0 days.

(21) Appl. No.: 14/844,003

(22) Filed: Sep. 3, 2015

(51) Int. Cl.
*G11C 11/401* (2006.01)
*G11C 11/4096* (2006.01)
*G11C 11/56* (2006.01)

(52) U.S. Cl.
CPC .......... *G11C 11/4096* (2013.01); *G11C 11/565* (2013.01)

(58) Field of Classification Search
CPC ....... G11C 11/409; G11C 11/56; G11C 7/06; G11C 29/50
USPC .................................................. 365/207, 208
See application file for complete search history.

(56) References Cited

U.S. PATENT DOCUMENTS

| 5,283,761 | A | * | 2/1994 | Gillingham | G11C 11/565 327/51 |
| 6,151,260 | A | * | 11/2000 | Birk | G11C 11/565 365/185.24 |
| 2006/0034130 | A1 | * | 2/2006 | Liu | G11C 11/565 365/189.02 |
| 2010/0067318 | A1 | * | 3/2010 | Senou | G11C 7/065 365/208 |

* cited by examiner

Primary Examiner — Richard Elms
Assistant Examiner — Jerome Leboeuf

(57) ABSTRACT

Tri-level-cell dynamic random access memory (DRAM) stores 3 levels of voltage (0, VDD/2, VDD) into a plurality of memory cells. Selected memory cell connected to bitline (BLT) to develop signal voltage, and adjacent reference bitline (BLR) develops reference voltage at VDD/2. An asymmetrical sensing amplifier (ASA), which has alternative positive offset and negative offset, is used to sense signal voltage and reference voltage for both their difference and sameness. ASA control signals, A and B, switch at different timing points or at different voltage level or the combination of both to have offset voltage set at either positive or negative polarity. Two consecutive read out from one ASA or one single read out from two ASA can be implemented to read memory cells data to local IOs. Output from ASA will be used to restore voltage back to the accessed memory cells.

11 Claims, 14 Drawing Sheets

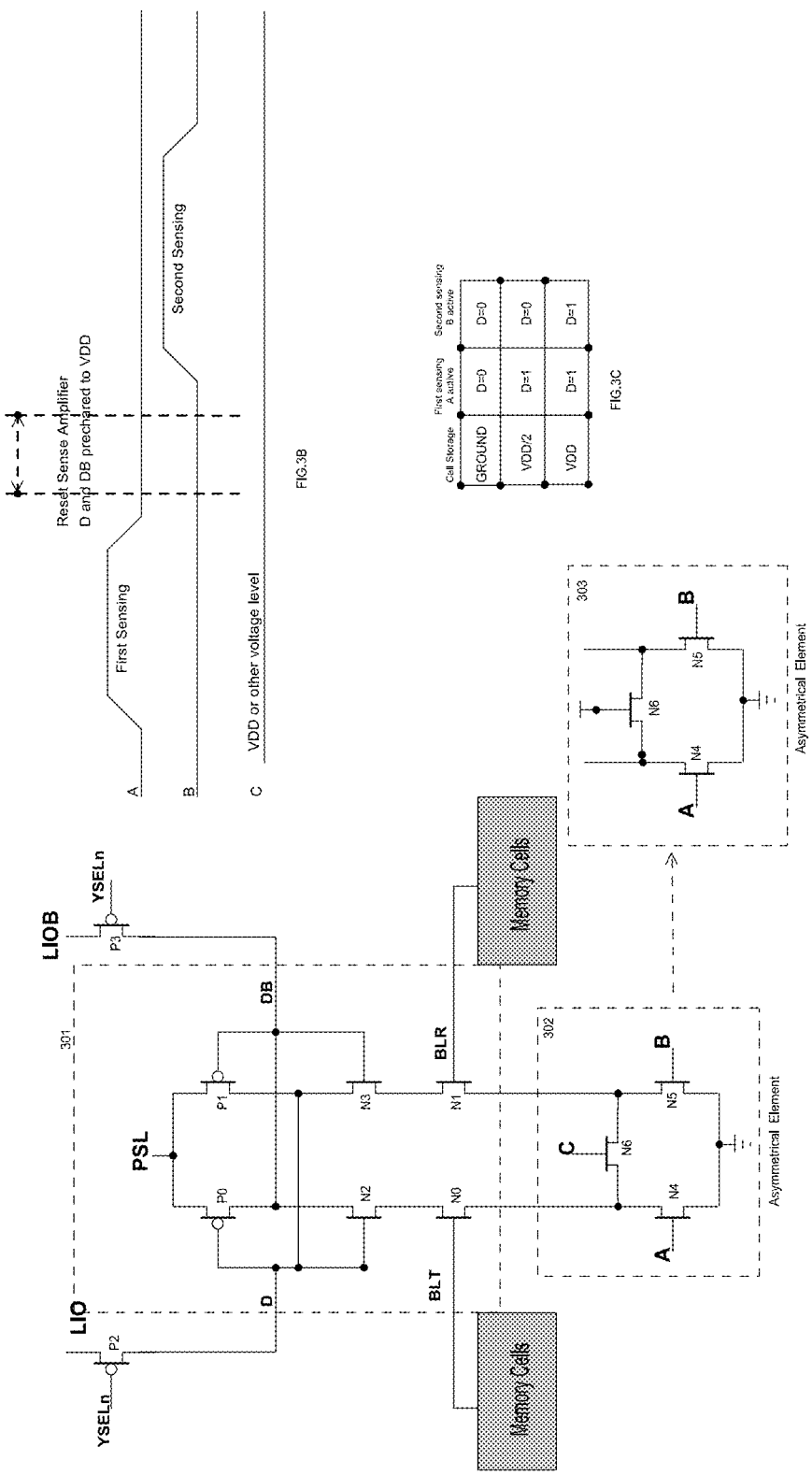

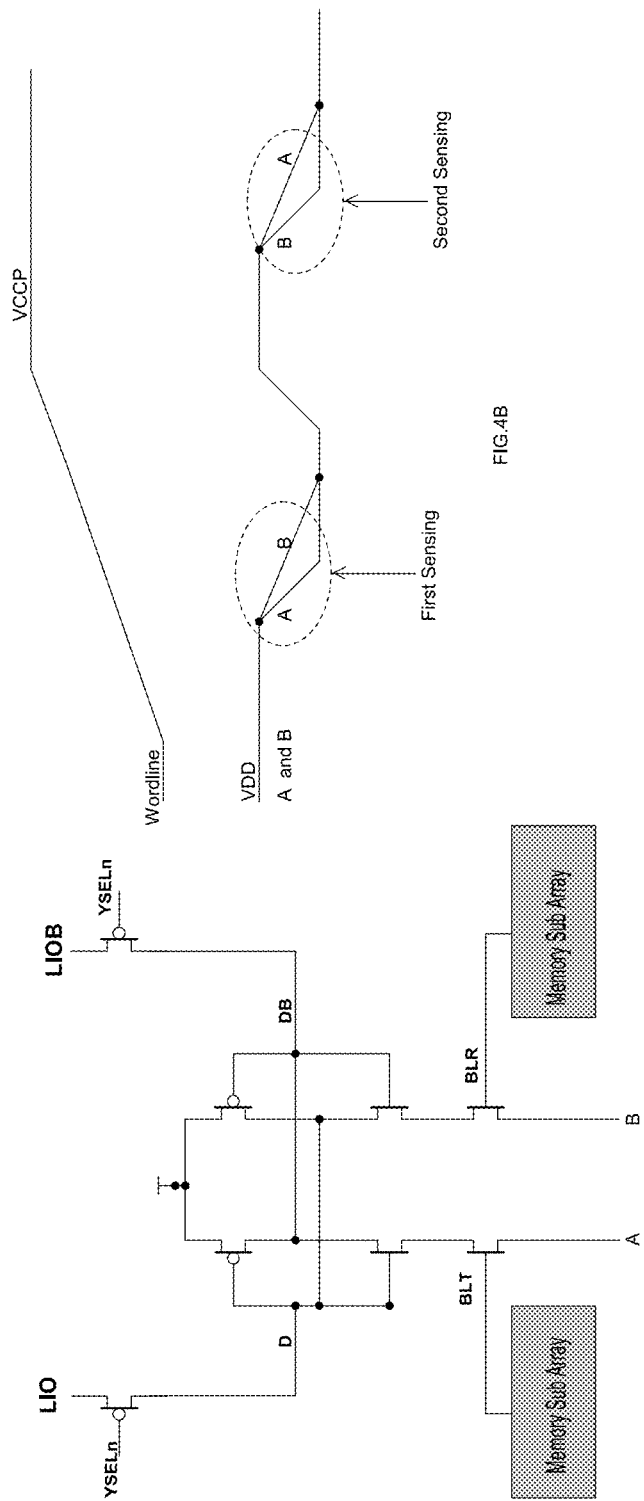

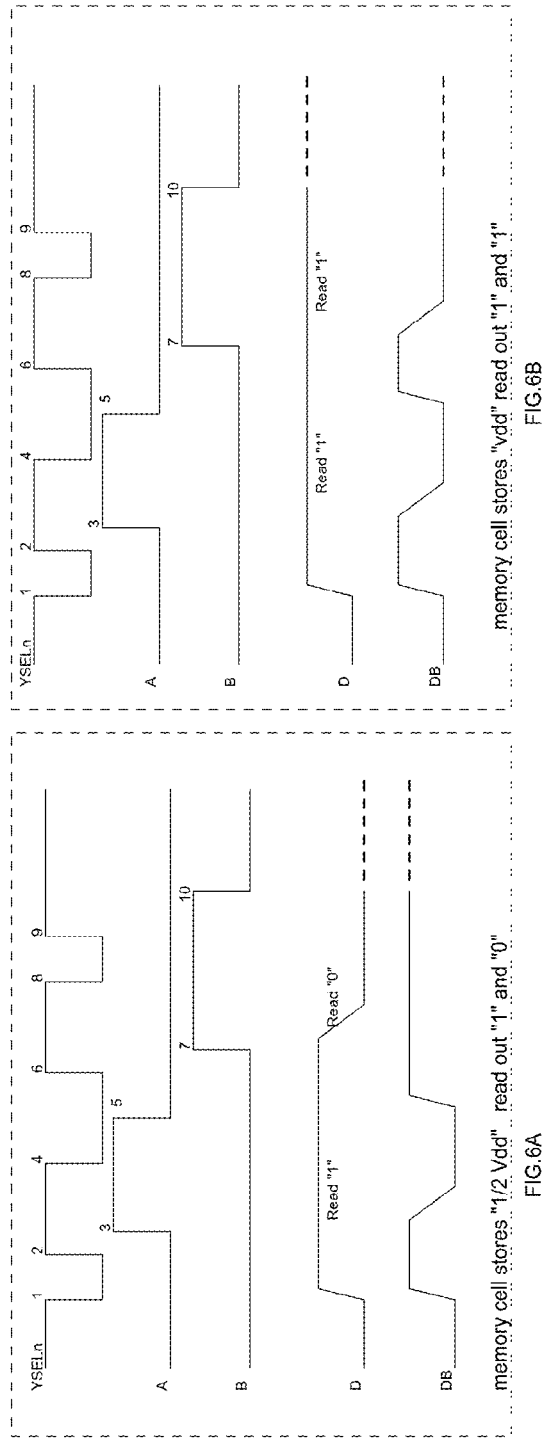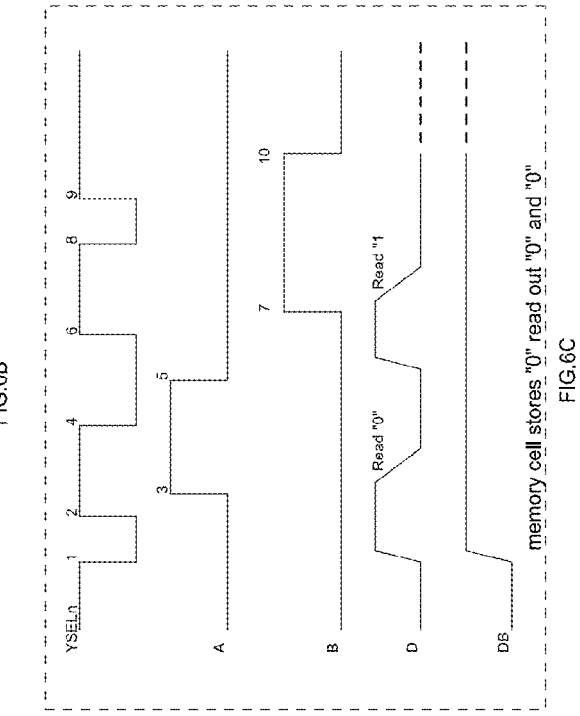

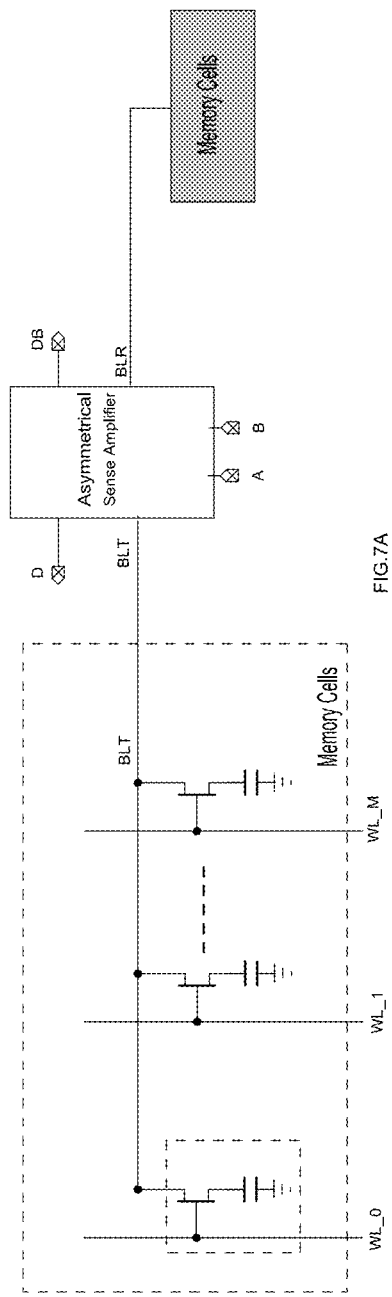
FIG.7A
FIG.7B
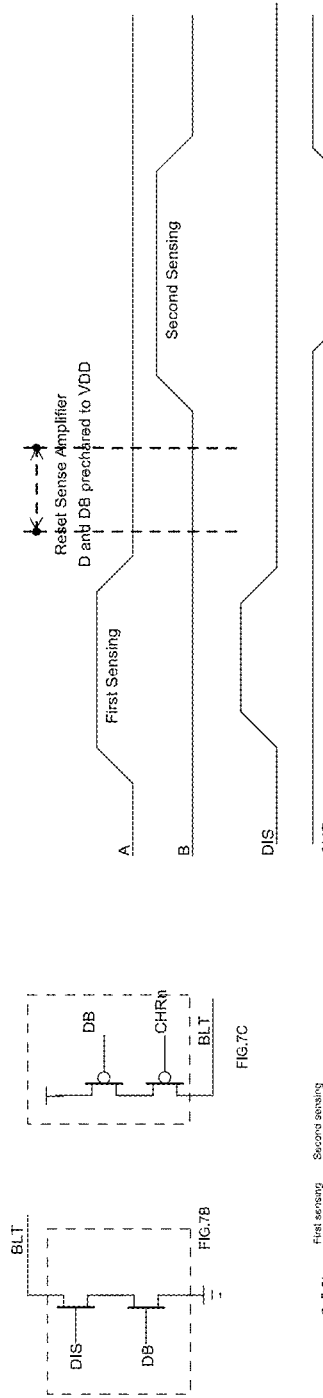
FIG.7D
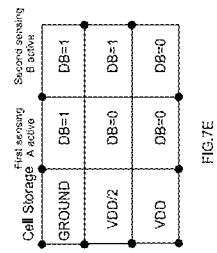
FIG.7E

TRI-LEVEL-CELL DRAM AND SENSE AMPLIFIER WITH ALTERNATING OFFSET VOLTAGE

BACKGROUND OF THE INVENTION

This invention relates generally to memory devices and particularly to dynamic random memory device with multilevel cell storage. A multi-level cell DRAM can store more than two voltage levels in the memory cells and thus can store more than one bit per cell. Although store four or more voltage levels in memory cells can achieve more density efficiency, in practice store three level voltage in memory cells is feasible due to availability of half VDD reference voltage and inherent noise margin issue in multi-level cell memory.

T. Furuyama et al ("Furuyama") in an article titled "An Experimental Two Bit/Cell storage DRAM for Macro Cell or Memory on Logic Application", IEEE J. Solid State Circuits, volume 24, number 2, page 388 to 393, April 1989 proposed one multilevel sense and restore method. In this scheme, four voltages stored in the memory and mapped to two bits, as shown in FIG. 1. For sense operation, cell charge share with bit line and bit line is split into three sub bit lines and then isolated from one another via switches. These three sub bit lines will be connected to three sense amplifier SA, SA compare three sub bit lines with three reference voltages and output corresponding 2 bit data. This method can read 2 bit data out at one time and fast, but the disadvantage of this scheme is also very obvious that it need three sense amplifiers, more switches and control circuit for sub bit line and a worst disadvantage is that it's susceptibility to sense errors with unstable globe reference voltage and small noise margin. And even this scheme is faster comparing to the following scheme, it still need more switching operations and decoding operations, these operation make this scheme still slower than most conventional DRAM.

U.S. Pat. No. 5,283,761 to Gillingham discloses the method and circuit to form two pairs of sub bit lines, with each pair having a sense amplifier, unlike the parallel sensing in the Furuyama scheme, the Gillingham scheme uses sequential sensing. In sequential sensing, the result of the first sense amplifier is used to generate the reference for the second sensing operation. An initial sensing operation compares the multi-level cell voltage to VDD/2 and if cell voltage above VDD/2 then the second sensing operation will compare cell voltage (after charge share with bit line) to a voltage reference of 5VDD/6. Conversely, if the first operation reveals cell voltage below VDD/2, the second operation will compare cell voltage with a voltage reference of VDD/6. The results of the two sensing operations produce 2 bit data. This scheme uses a local generation of reference voltage and therefore can reduce some noise from globe reference voltage use in Furayama. The disadvantage of this scheme is that it still use 2 sense amplifier and has lots of control and switches circuit for sub bit line concept, it also has the problem of much low noise margin compare to conventional DRAM because needs more reference voltage levels. Furthermore, the speed is even slower than Furuyama's scheme.

U.S. Pat. No. 6,556,469 to Birk et al. discloses the method to combine the benefits of Furayama's parallel sensing and Gillingham's using of local reference voltage. Nevertheless, this scheme is limited by the prior scheme's low noise margin problem of multi-level DRAM.

U.S. Pat. No. 7,133,311 to LIU. discloses the method to use asymmetrical sensing to distinguish three different voltages in memory cell without using any special reference voltage. Both multiplex for connection and fixed offset based sense amplifier are used to implement the asymmetrical sensing.

U.S. Pat. No. 8,773,925 to Koya et al. discloses the method to store 4 levels in dram cells. It uses preamp and also uses local bitline and global bitline for sensing. However the noise margin is still the major concern and too many different sensitive voltage levels are used in the design.

BRIEF SUMMARY OF THE INVENTION

In the present invention, a tri-level-cell (TLC) DRAM has been design for storing 3 voltage level of "0", "vdd/2" and "vdd" in a dynamic memory cells. An asymmetrical sensing method is used to effectively sensing the signal voltages and reference voltage for their difference and sameness.

By switching the asymmetrical sense amplifier (ASA) offset voltage polarity, 3 different voltage levels can be read out using just one reference voltage level. The ASA's two control signals (A and B) can be set at different voltage level, or different driving strength at different timing points, or the combination of both.

The ASA has two inputs BLT and BLR, the ASA has an intentionally introduced offset between BLT and BLR, furthermore the offset polarity can be changed by switching two control signals, A and B. For sensing "vdd/2", the offset voltage will dominate the sensing result and will read out opposite results as the offset polarity switches. For sensing "0" and "vdd" cases, the BLT and BLR difference will dominate the sensing result and read out same results as the offset polarity switches. Write back circuit controlled by sensing result can write "0" and "vdd" voltage back to memory cells. Vdd/2 precharge scheme can also write "vdd/2" voltage back to memory cells from bitline precharge level.

The BLT and BLR connections to bitline pair can also be switched by the selections of passing transistors.

Both differential and latch based ASA sensing amplifier are draw in the present invention. The asymmetrical element can be attached to either pmos side or nmos for offset voltage setting and polarity switching. The asymmetrical element can also be shared by multiple conventional sense amplifier and thus form multiple asymmetrical sense amplifier.

The power consumption at the sense operations of this TLC-DRAM is smaller than conventional DRAM. There are two reasons: 1. The two consecutive sense operations access the same physical memory cells, thus the bit line pair will only be precharged once. 2. If a memory cell stores a voltage level of VDD/2, the voltage of bit line pair will not change and therefore do not need much pre charge current for bit line pair capacitor.

BRIEF DESCRIPTION OF THE DRAWINGS

The present invention will be described by way of examples with reference to the following drawings in which:

FIG. 3A is schematic for a sense amplifier with control signals A, B and asymmetrical element to form an ASA with both positive and negative offset.

FIG. 3B is the timing diagram to illustrate the A and B switching behaviors.

FIG. 3C lists the 3 different data from 3 storage cases.

FIG. 4A is another example of ASA, instead of using full logic level, it directly use analog voltage on A and B.

FIG. 4B is the timing diagram for A and B and the selected wordline.

FIG. 6A, FIG. 6B, FIG. 6C are the control signals and data output waveform of memory cells read operation for three different memory cells voltage cases.

FIG. 7A is the block diagram for memory cell interconnection to ASA.

FIG. 7B is the write back circuit for "0" case.

FIG. 7C is the write back circuit for "1" case.

FIG. 7D is the timing diagram for charge and discharge control signals.

FIG. 7E is the sensing data for 3 voltage cases.

DETAILED DESCRIPTION OF THE INVENTION

Tri-Level-Cell DRAM (TLC-DRAM) can write, read and restore one of three different voltage levels, respectively ground (0) and VDD/2 and power supply (VDD), into a single memory cell. By storing 3 levels into memory cell, log 2(3)=1.58 bit per cell storage can be realized and effectively increase memory density compare to conventional two level DRAM or one bit per cell storage.

Figure 1:
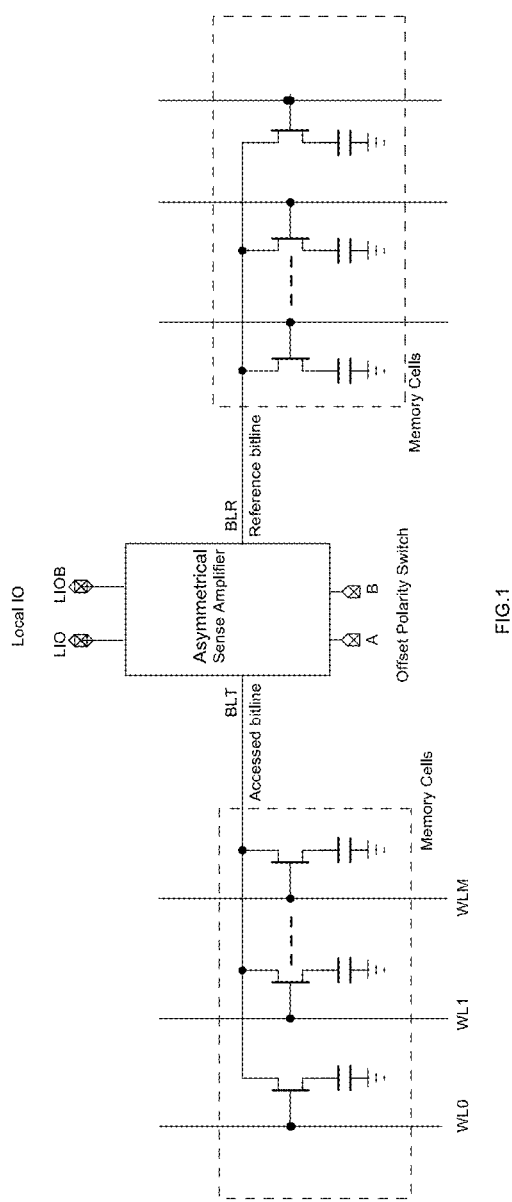
FIG. 1 is a diagram illustrating the Asymmetrical Sense Amplifier (ASA) which has connections with bitline pair, data input/output and offset switchable control signals, A and B.

FIG. 1 illustrates a highly simplified example of TLC-DRAM in accordance with one embodiment. An asymmetrical sense amplifier (ASA) connected to signal bitline (BLT) and reference bitline (BLR). When wordline opens BLT connected to the accessed memory cell and BLR connected to the reference bitline. The ASA has two control signals, A and B for ASA offset setting and polarity switching. Local IOs (LIO/LIOB) are for data read and write operations.

Figure 2A:
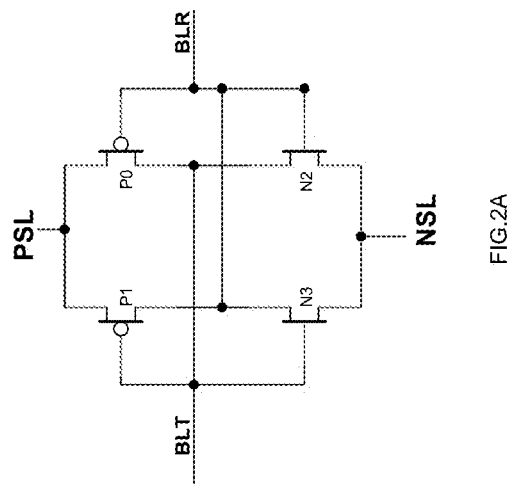
FIG. 2A is a diagram illustrating the conventional latched based sense amplifier for a two-level DRAM.
Figure 2B:
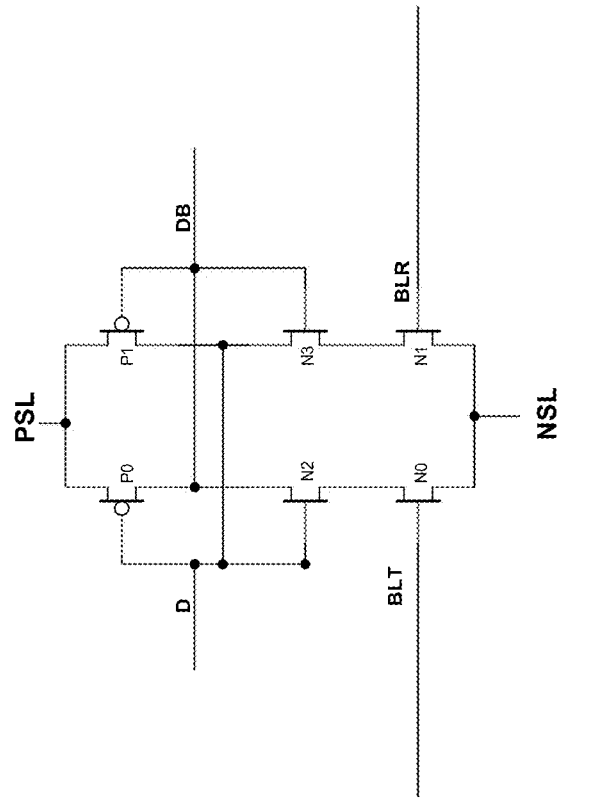
FIG. 2B is a diagram illustrating another kind of conventional differential sense amplifier.

These three voltage levels (ground, VDD/2, VDD) are naturally available in all kind of DRAMs designs, however the VDD/2 voltage is always used as the reference voltage for conventional sense amplifier to distinguish if the signal voltage, from cell stores "ground" or "vdd", is higher or lower than the reference voltage. In other words, the conventional sense amplifier is designed to detect the two inputs voltage difference (BLT and BLR) and output the data ("1" or "0") correspondently. FIG. 2A and FIG. 2B depict the conventional latch based sense amplifiers (Prior Art). The conventional SA is designed to detect the two input voltages' difference; however it can't detect voltages' sameness.

To sense three different voltages from DRAM, the conventional SA needs to use reference voltage other than VDD/2, as the sense amplifier can't detect VDD/2 and can't make correct decision if both signal voltage and reference voltage are the same at VDD/2 level. To still use VDD/2 as the reference voltage and sense three different voltage levels, an asymmetrical sense amplifier is designed to have both positive and negative offset between two voltage inputs (BLT and BLR).

FIG. 3A is a schematic for a differential based asymmetrical sense amplifier that can detect two inputs voltages' difference and sameness. 301 is a conventional SA, D and DB node are precharged to VDD through LIO and LIOB during reset or precharge phase. 302 is an example of the asymmetrical element that use control signals A and B to switches the pull down strength for the BLT and BLR sides, C is turns on by applying a voltage on the passing gate. 303 is a variation of 302 with C directly connected to vdd. When A is active and B is grounded, the BLT transistor's current directly flow through transistor N4 to ground. On the other side, the BLR transistor's current flows through transistor N6 and transistor N4 to ground. In this implementation BLT transistor has a stronger pull down and SA has a positive offset. When B is active and A=0, the BLR transistor has a stronger pull down and SA has a negative offset. If BLT and BLR voltage is the same, the read out from D or LIO will be different in these two step sensing operation. Thus the ASA has the ability to detect if the voltage levels are the same or not.

However if the memory cells stores "vdd" level, the respective bitline voltage on BLT is stronger enough to overcome the asymmetrical element introduced offset voltage and always output "1" at the "D" node.

On the other side, if the memory cells stores "0" level, the respective bitline voltage on BLT is weaker enough and always output "0" at the "D" node.

The intentional introduced offset values can be adjusted by the control voltage level on the gates of asymmetrical element transistors' (N4,N5,N6) or adjust these transistors' the width and length.

As an example, the offset voltage maybe set at 50 mv, while the signal voltage difference can be achieved at 100 mv or more depends on the bitline capacitance to cell capacitance ratio. If the signal voltage and reference are the same, the offset voltage will dominate the sensing operation and read out two opposite data "1" and "0" in two operations as the offset polarity changes. Otherwise the 100 mv voltage difference can override the offset and read out either "11" or "00" data respectively if memory cells store "vdd" or "0".

FIG. 3B is the timing diagram to illustrate the A and B switching behaviors. C can be set to VDD or other voltage level for offset adjustment.

FIG. 3C lists the 3 different data from the read operations corresponding to the 3 storage cases.

FIG. 4A is the another example of designing ASA, instead of using logic full vdd or 0 for A and B, this ASA directly uses analog voltage on A and B with different driving strength. FIG. 4B shows the timing diagram for A, B and the wordline WL.

An example of A and B are their voltage start from vdd, thus both BLT and BLR transistors are off at the beginning. When selected wordline WL rises over a certain threshold voltage, the A and B will start discharge. However to skew the offset on BLT side, A has a stronger and faster discharge rate than B. The sensing result will favor BLT side and output data according to FIG. 3C first sensing table. After this first sensing, ASA D and DB node reset to vdd level. When wordline rises up to VCCP level, the A node and B node will start discharge. However at this time, B node has a stronger and faster discharge than A node. The sensing result will favor BLR side and output data according to FIG. 3C second sensing table.

By applying different and controllable analog voltages on A and B nodes, conventional sense amplifier can become asymmetrical sense amplifier with build-in offset voltage and switchable positive or negative polarity. The asymmetrical element controlling A and B can be shared among multiple sense amplifier and effectively form multiple asymmetrical sense amplifiers. Furthermore each memory array can have its own asymmetrical element with adjustable offset for the specific memory array data operation.

Figure 5:
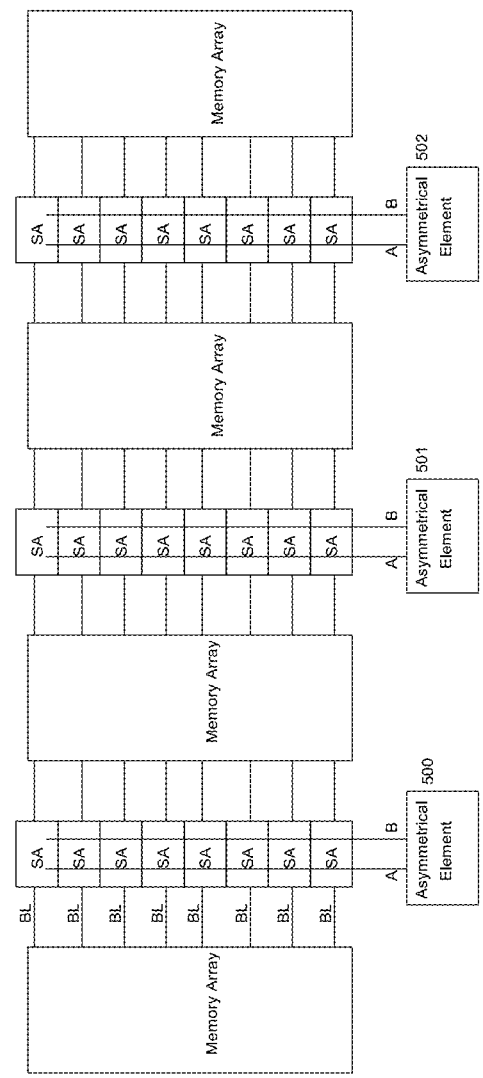
FIG. 5 is a diagram to illustrate multiple array structure with multiple asymmetrical elements.

FIG. 5 is a multiple array with multiple asymmetrical elements. For example, element 500 can be set with an offset of dV1, while element 501 with an offset of dV2. The different offset setting can be achieved by using different transistors size and different metal connection for these asymmetrical element transistors.

FIG. 6A, 6B, 6C are the timing diagram for the three different voltage read out cases.

FIG. 6A is the memory cell stores VDD/2 voltage case, during time point 1-2, YSELn turns on and LIO/LIOB precharge D and DB to vdd level. At time point 3, control signal "A" turns on to skew the strength on BLT side. Since BLT and BLR are the same voltage at Vdd/2 level, BLT will have more strength, D will keep "vdd" and DB will be discharged to "vss". During time point 4-5, YSELn turns on to output data from D to LIO. During time point 5-6, D and DB prechared to vdd level through LIO and LIOB. At time point 7, control signal B turns on to skew the strength on BLR side, since BLT and BLR are the same voltage, BLR will have more strength as B turns on, DB will keep "vdd" and D will be discharged to "vss". During time point 8-9, YSELn turns on to output data from D to LIO. In this two steps sensing operation, "vdd/2" case read out "1" and "0" data respectively.

FIG. 6B is the memory cell stores VDD voltage case, during time point 1-2, YSELn turns on and LIO/LIOB precharge D and DB to vdd level. At time point 3, control signal "A" turns on to skew the strength on BLT side. Since BLT voltage is higher (~100 mv) than the BLR reference voltage at Vdd/2 and BLT has more strength as A turns on, D will keep "vdd" and DB will be discharged to "vss". During time point 4-5, YSELn turns on to output data from D to LIO. During time point 5-6, D and DB prechared to vdd level through LIO and LIOB. At time point 7, control signal B turns on to skew the strength on BLR side, since BLT voltage is higher (~100 mv) than the BLR reference voltage, Although B turns on makes ASA has a negative offset, the BLT minus BLR voltage difference can still overcome this offset voltage and D will keep "vdd" and DB will be discharged to "vss". During time point 8-9, YSELn turns on to output data from D to LIO. In this two steps sensing operation, "vdd" case read out "1" and "1" data respectively.

FIG. 6C is the memory cell stores "0" voltage case. BLT voltage is lower (~100 mv) than the BLR reference voltage at Vdd/2 level. In the same two steps sensing operation as, "0" case read out "0" and "0" data respectively.

Dynamic memory cell stores analog voltages on capacitors, the capacitor will leak the storage charge. Also during the read operation, the charge will also be destroyed when share with bitline capacitor. For DRAM cells, periodical refresh and read restore circuits are necessary to keep charge on the cell capacitors.

FIG. 7A is the block diagram to illustrate the memory cells interconnections to ASA. Assume BLT side is used for accessed memory cell and BLR side is used for reference bitline.

In TLC-DRAM design, the bitline is precharged to vdd/2. For cell storage at vdd/2, there is no difference between bitline and cell voltage, cell capacitor will keep vdd/2 voltage level. Thus there is no need to write back vdd/2 voltage.

For cell storage at "0", the first read out data is "D=0 or DB=1". The DB node can be used to discharge bitline to "0" and write back "0" into the accessed memory cell. FIG. 7B is the write back circuit for "0" storage case. During the first sensing period, DIS signal will be active and if DB=1, the BLT will be discharged to ground and "0" is write back into memory cell. The DIS signal will be off after the first sensing, however the bit line is already discharged to ground. FIG. 7D is the timing diagram for the DIS control signal timing regarding to "A" signal in the first sensing operation.

For cell storage at "vdd", the first sensing data is "D=1 or DB=0". The discharge circuit will turns off as DB=0. The second sensing data is "D=1 or DB=0", FIG. 7C is the write back circuit for "vdd" storage case. During the second sensing period, CHRn signal will be active and if DB=0, the BLT will be charged up to vdd and write back into memory cell. FIG. 7D also has the timing diagram for the CHRn control signal timing regarding to B signal in the second sensing operation.

FIG. 7E is the table for 3 case sensing data result, but uses DB node as an example.

Figure 8:
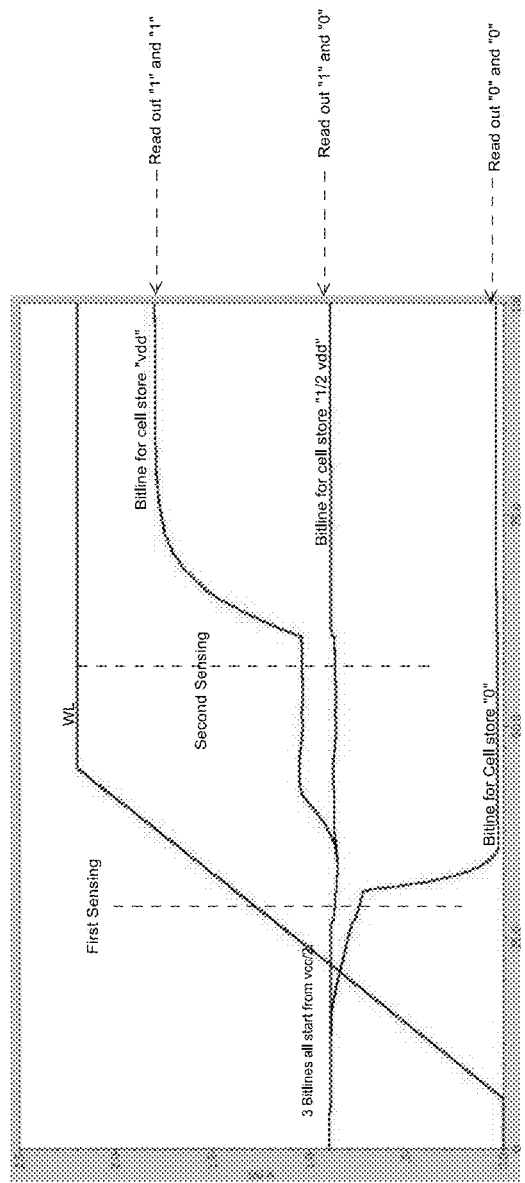
FIG. 8 is the bitline voltage read/restore operation waveform of three different voltages in memory cells.

FIG. 8 is a simulation timing diagram for showing three bitline voltage level of 3 different storage cases. Wordline voltage timing also shows in the waveform. All three bitlines start from vdd/2 voltage. As wordline raises up the bitline voltage first developed for the "0" voltage case. At the first sense time, since the "0" case bitline voltage is lower than reference voltage (vdd/2), D=0 and DB=1, this bitline for "0" case got discharged to "vss". At the second sensing time, the "vdd" case bitline is higher than reference, D=1 and DB=0, this bitline for "vdd" case got charged up to "vdd".

For the "vdd/2" bitline case, both discharge and charge write back circuit will turn off and the bitline will keep vdd/2 voltage level.

Figure 9:
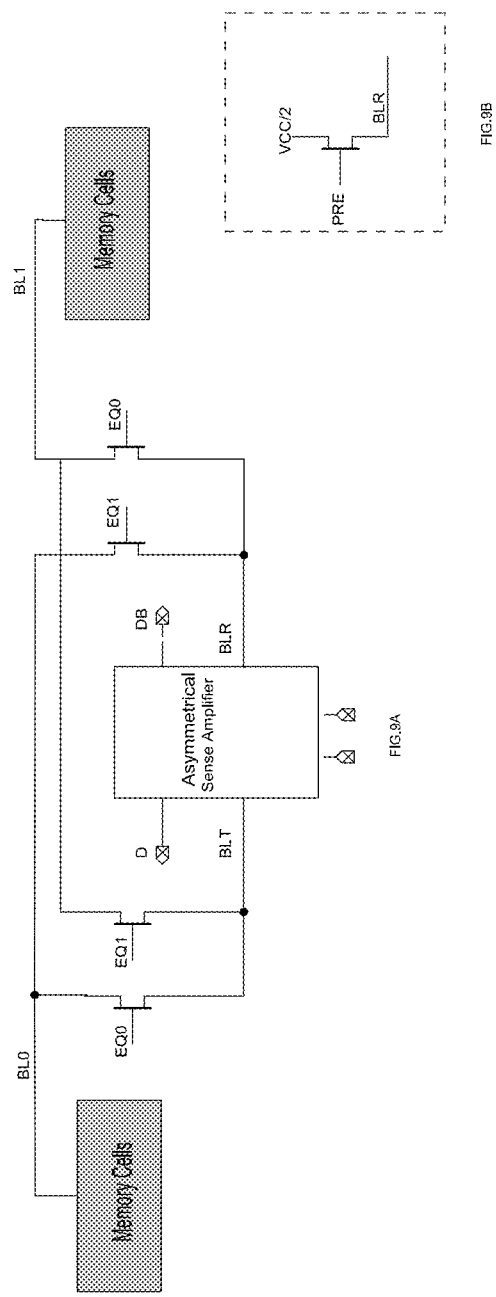
FIG. 9A is the block diagram for switchable interconnections between bitline pairs and BLT/BLR inputs of ASA.
FIG. 9B is the vdd/2 precharge circuit connected to BLT.

Although all the previous examples use BLT as the signal bitline and directly connect to memory cells. It is practical to have pass gates to switch connection between BLT/BLR and the respective memory arrays. FIG. 9A is block diagram to illustrate that using 4 transistor to connect BLT and BLR to respective bitline pairs. When EQ0 turns on, BL0 connected to BLT and BL1 connected to BLR. When EQ1 turns on, BL0 connect to BLR and BL1 connected to BLT. FIG. 7B shows a vdd/2 precharge circuit that precharge BLT to vdd/2 voltage. And this vdd/2 level can be shared between bitlines.

Figure 10:
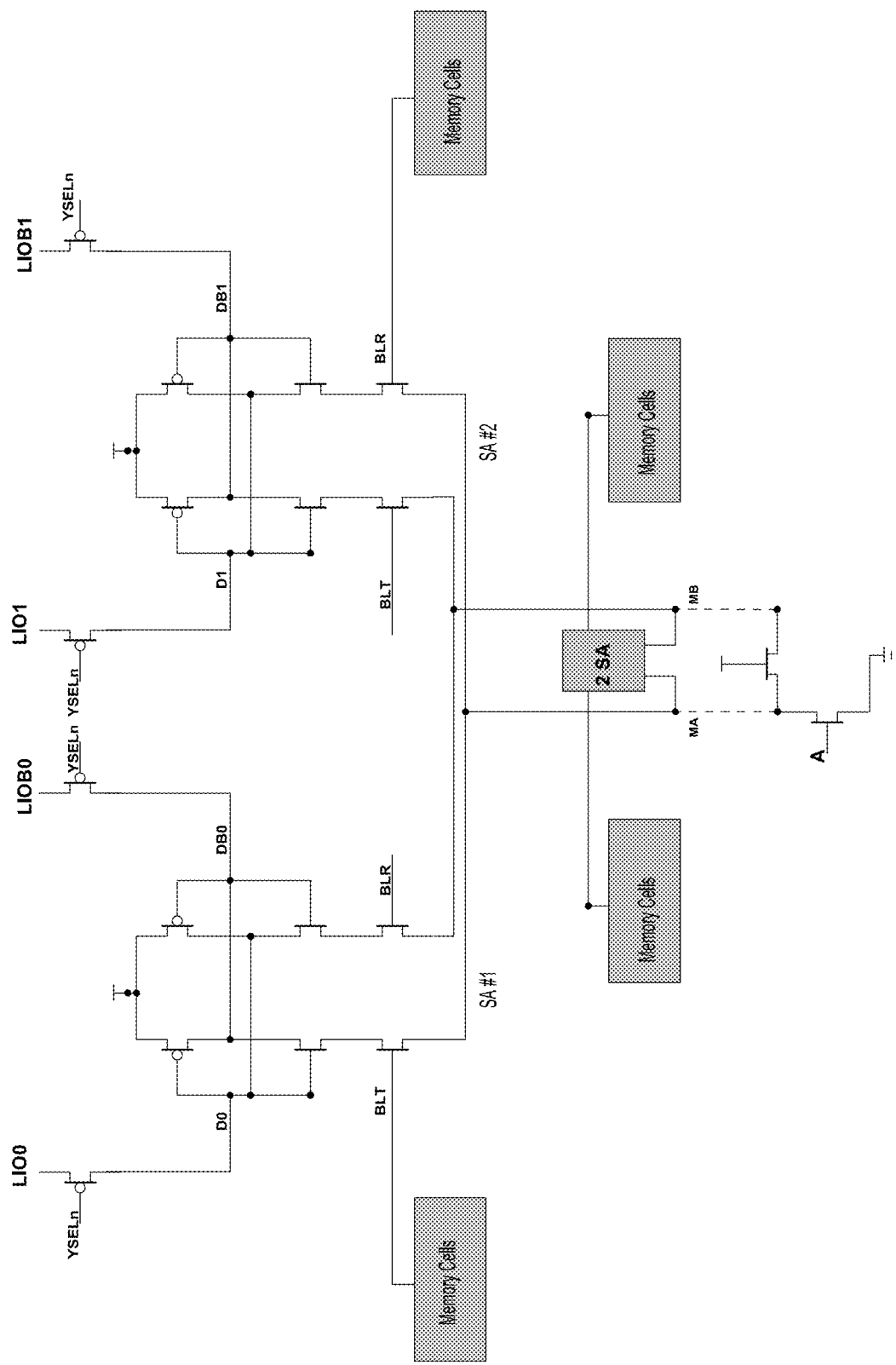
FIG. 10 is a block diagram of using two sense amplifiers together for one bitline pair sensing.

In one of the other embodiment for TLC_DRAM, it is also feasible to use two SA for one pair of bitline sensing and read out the data in one sensing operation. FIG. 10 shows the block diagram of the connections between two ASA and the bitline pairs. The two SA has different pull down connection. SA#1 has BLT connected to MA side, SA #2 has BLR connected to MA side. MA side has a stronger pull down compare to MB side. During the sensing operation, as "A" signal in the asymmetrical element turns on the two SA will operate together but with SA#1 skews on BLT side and SA#2 skews BLR side. If cell voltage is "0" or "vdd", the voltage difference between BLT and BLR will overcome the offset effect and read out "0" "0" and "1" "1" from these two SA. If cell voltage is "vdd/2", the BLT and BLR voltage will be the same and thus the offset polarity will play effect and read "1" and "0" from these two SA.

Use two sense amplifier together for one bitline pair will increase the SA overhead circuit, however the speed will be faster as there is no need to reset SA and do two step sensing operations.

Figure 11:
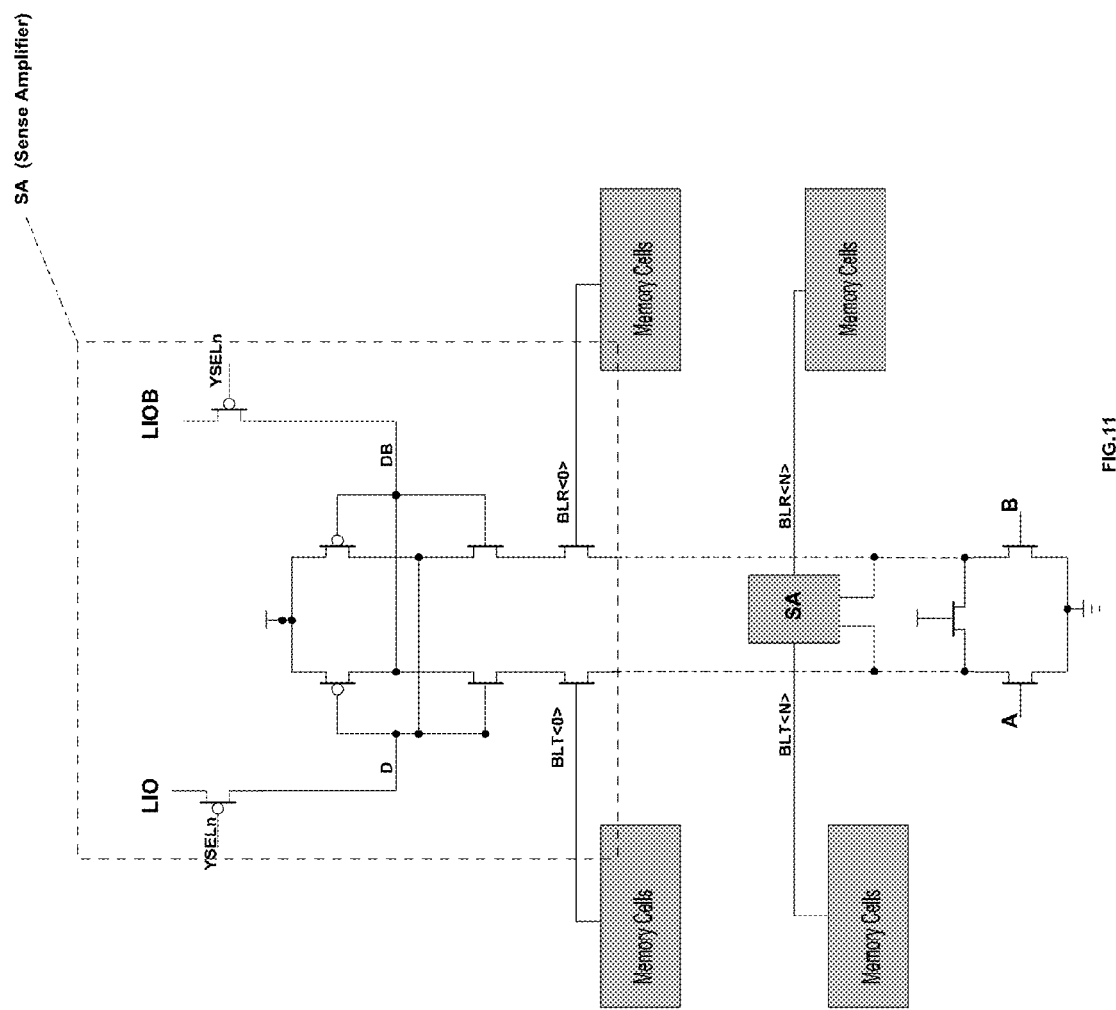
FIG. 11 is a block diagram of using the asymmetrical element for multiple conventional sensing amplifiers to support multiple bitline pair sensing.

FIG. 11 illustrates a block diagram for using one asymmetrical element to support multiple conventional sense amplifier and thus all the sense amplifier can be considered as asymmetrical SA.

Figure 12:
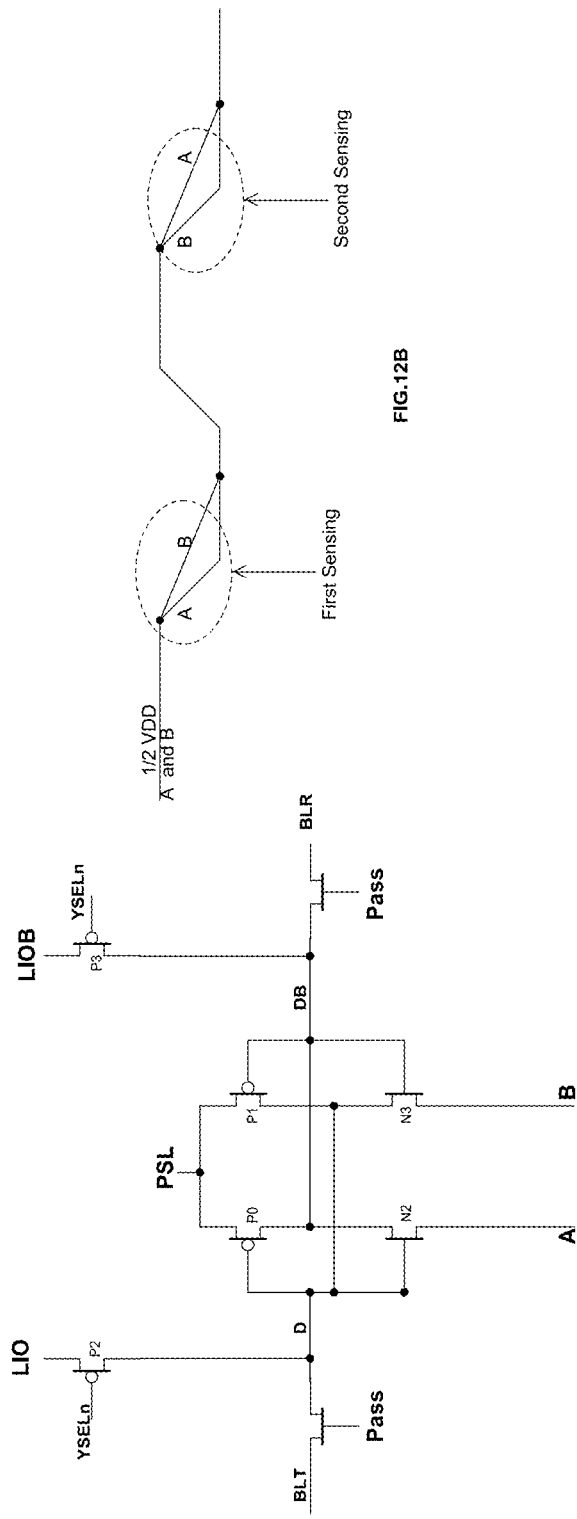
FIG. 12A is an example of the latched based ASA which uses conventional SA with control signals (A and B) for offset polarity switching.
FIG. 12B is a timing diagram for the A and B signals switching.

Although the ASA uses differential based sense amplifier with switchable offset, it is naturally expanded to latch based sense amplifier. FIG. 12A depicts an ASA with conventional sense amplifier and connected the source sides to two switchable signals A and B. A and B start from vdd/2 voltage as shown in FIG. 12B. BLT and BLR are connected to D and DB node through pass transistors. For the case of "vdd/2" storage, when the sensing operation starts, the A node will be discharged faster than B node and thus D node will dominate the sensing result; when the second sensing start, the B node will be discharged faster than A node and thus DB node will dominate the sensing result. For the cases of "0" and "vdd" storage, the signal voltage will overcome the offset and read out "00" and "11" respectively.

Although the previous examples connect asymmetrical elements to NFETs source sides and change the offset of sense amplifier, it infers that PFET side can also connect asymmetrical elements and create switchable offset for conventional sense amplifier.

Figure 13:
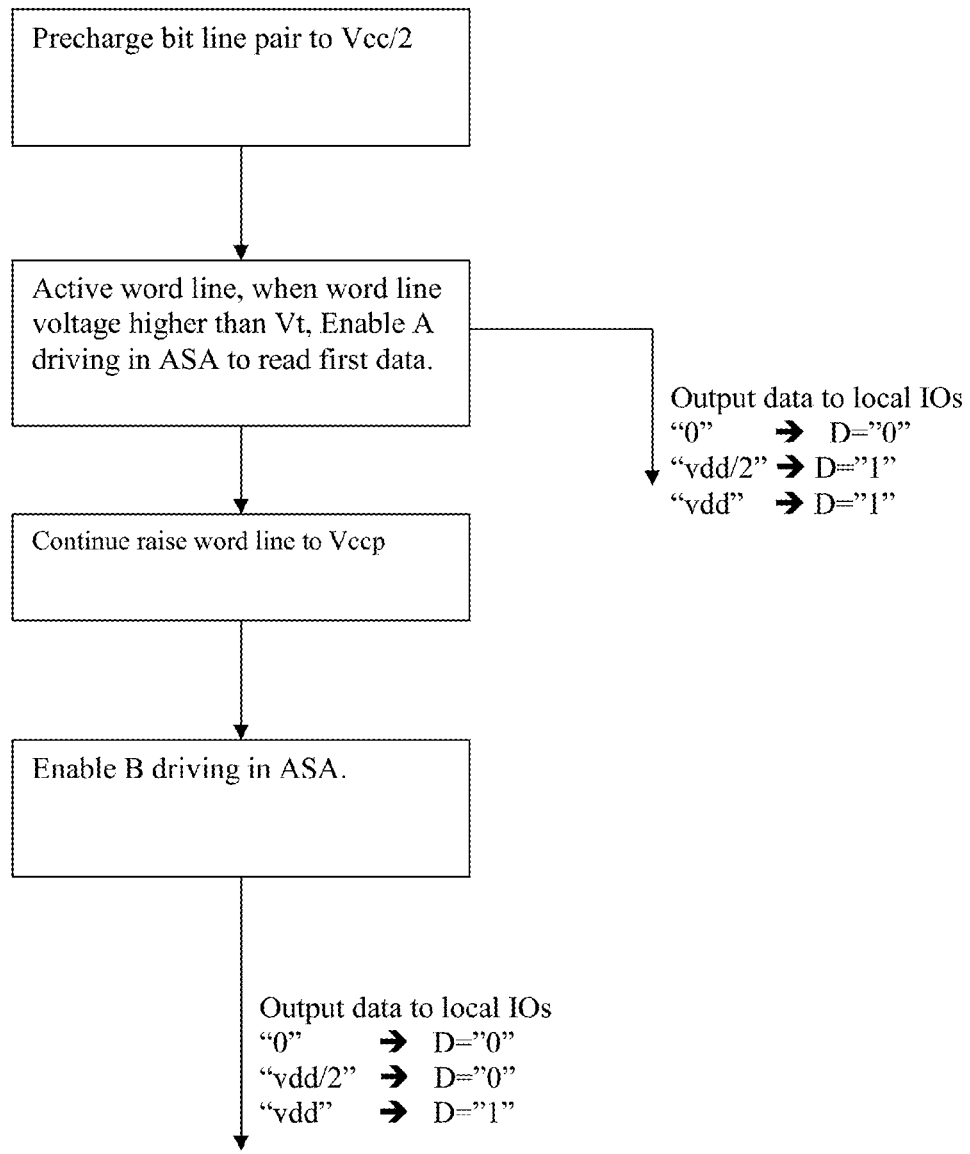
FIG. 13 is a flowchart diagram illustrating two consecutive sensing operations according to an embodiment of the present invention.

FIG. 13 is the flowchart of using one ASA for one pair of bitline sensing. It read out first sensing data and switching the offset polarity and read out second sensing data.

Figure 14:
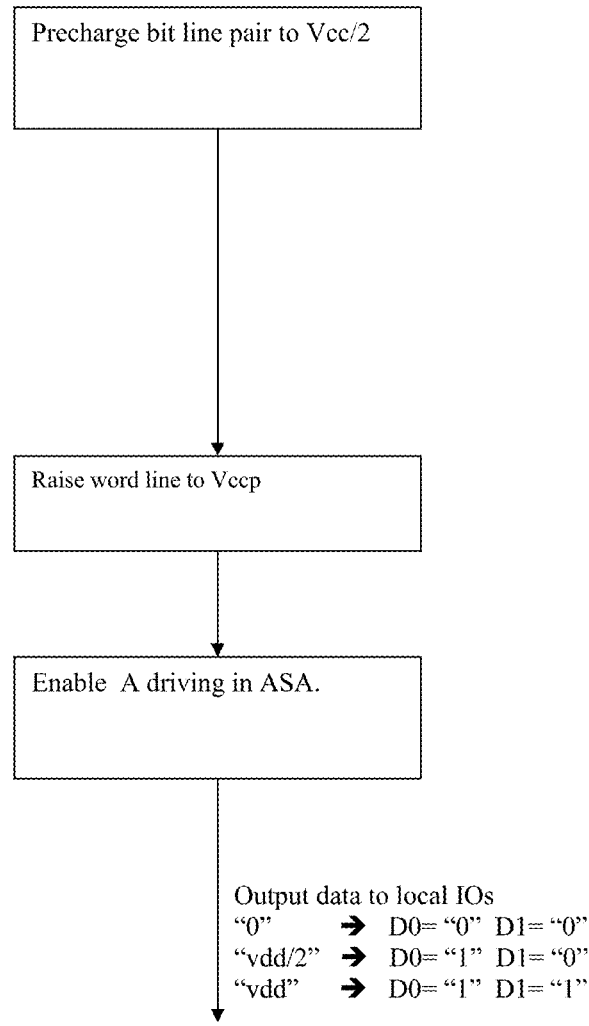
FIG. 14 is a flowchart diagram illustrating one single sensing operation and read out multiple data at the same time.

FIG. 14 is the flowchart of using two ASA at the same time to sense data from two ASA directly in one sensing operation.

While the present TLC-DRAM invention has been described in examples of specific elements' interconnections and embodiments, variations of these embodiments are also envisioned. Circuit variation is often in the electrical circuit design area. Therefore, the scope of the appended claims should not be limited to forgoing descriptions.

What is claimed is:

1. A Tri-level-cell (TLC) dynamic random access memory (DRAM), comprising:
    a plurality of memory cell arrays, wherein the memory cells are to store vdd, vdd/2 and ground voltage in cell capacitor to represent 3 states, or 1.58 bits per cell;
    an asymmetrical sense amplifier (ASA) with controllable and switchable positive and negative offset voltage for sensing operation especially for TLC-DRAM, wherein an offset polarity is switchable by two different control signals that activated at different timing points or with different analog voltage levels at different timing points;
    a restore and write back circuits for data writing and restoring; and
    multiple Interconnections between bitline pairs and ASA's voltage inputs.

2. The memory of claim 1, wherein the asymmetrical sense amplifier is a conventional sense amplifier with asymmetrical elements which has an adjustable offset voltage and switchable positive and negative polarity.

3. The memory of claim 1, wherein the ASA adjusts offset levels by setting a different asymmetrical driving strength.

4. The memory of claim 2, wherein for the plurality of memory arrays, multiple conventional sense amplifiers share a single asymmetrical element to form multiple asymmetrical sense amplifiers.

5. The memory of claim 4, wherein the multiple ASAs adjust the offset polarity for individual memory arrays.

6. The memory of claim 1, wherein the ASA senses two inputs' voltage difference; and senses two inputs' voltage sameness through offset polarity switching.

7. The memory of claim 1, wherein the write back circuit uses the asymmetrical sense amplifier's output data to write back the voltage level on the bitline and write back to the memory cells.

8. The memory of claim 1, wherein the asymmetrical sense amplifier is implemented with any general sense amplifier circuit by adding asymmetrical elements, wherein the asymmetrical element with switchable offset can be attached to either a pfet side or a nfet side of the sense amplifier.

9. The memory of claim 1, wherein the asymmetrical sense amplifier works in symmetrical mode when both control signals, A and B, are set at exactly the same voltage or strength.

10. A method for reading out Tri-Level-Cell DRAM compromising of
    setting an asymmetrical sense amplifier (ASA) offset polarity be positive during one sensing operation, and setting the ASA offset polarity be negative during a successive sensing operation; wherein the offset polarity is switchable by two different control signals that activated at different timing points or with different analog voltage levels at different timing points.

11. A method for reading out Tri-Level-Cell DRAM compromising of
    setting two asymmetrical sense amplifiers (ASA) to opposite offset polarities so that they are used together to read out different data when ASAs' two inputs are the same or read out the same data when ASAs' two inputs are different; wherein the offset polarities are switchable by two different control signals that activated at different timing points or with different analog voltage levels at different timing points.

* * * * *